(12) United States Patent
Favre et al.

(10) Patent No.: US 7,790,479 B2
(45) Date of Patent: Sep. 7, 2010

(54) METHOD AND DEVICE FOR MONITORING THE CONTAMINATION OF SUBSTRATE WAFERS

(75) Inventors: Arnaud Favre, Annecy (FR); Remi Thollot, Cruseilles (FR); Xavier Metais, Meythet (FR); Jean-Pierre Desbiolles, Cruseilles (FR); Francoise Desbiolles, legal representative, Cruseilles (FR)

(73) Assignee: Alcatel, Paris (FR)

( * ) Notice: Subject to any disclaimer, the term of this patent is extended or adjusted under 35 U.S.C. 154(b) by 1010 days.

(21) Appl. No.: 11/377,555

(22) Filed: Mar. 17, 2006

(65) Prior Publication Data

US 2006/0292037 A1    Dec. 28, 2006

(30) Foreign Application Priority Data

Mar. 18, 2005    (FR)    ................................... 05 50703

(51) Int. Cl.
*G01R 31/26* (2006.01)
(52) U.S. Cl. ........................... 438/14; 422/83; 438/800; 250/288
(58) Field of Classification Search ........... 438/14; 422/83; 250/281–300; 73/23.2
See application file for complete search history.

(56) References Cited

U.S. PATENT DOCUMENTS

| | | | |
|---|---|---|---|
| 5,233,191 A | | 8/1993 | Noguchi et al. |
| 5,468,302 A | * | 11/1995 | Thietje ........................... 134/1 |
| 5,846,338 A | * | 12/1998 | Bonora et al. .................. 134/11 |
| 6,287,023 B1 | | 9/2001 | Yaegashi et al. |
| 6,398,032 B2 | * | 6/2002 | Fosnight et al. .............. 206/711 |
| 6,758,876 B2 | * | 7/2004 | Suzuki et al. .............. 55/385.6 |
| 2001/0042439 A1 | * | 11/2001 | Roberson et al. ................. 95/8 |
| 2004/0023419 A1 | | 2/2004 | Kishkovich et al. |

FOREIGN PATENT DOCUMENTS

| | | |
|---|---|---|
| DE | 101 33 520 A1 | 1/2003 |
| JP | 2002184828 A * | 6/2002 |
| JP | 2003142541 A * | 5/2003 |

* cited by examiner

*Primary Examiner*—Jill Warden
*Assistant Examiner*—Shogo Sasaki
(74) *Attorney, Agent, or Firm*—Carmen Patti Law Group, LLC

(57) ABSTRACT

A device is used to measure contamination directly in transport enclosures of FOUP or SMIF type, for example. The transport enclosure is placed on an adapter that sets up direct communication between it and an external gas analyzer. The gas analyzer ionizes the sampled gases and performs the analysis by measuring a parameter of the ions resulting from this ionization. This measures very low levels of gaseous contamination in real time.

23 Claims, 3 Drawing Sheets

FIG_1
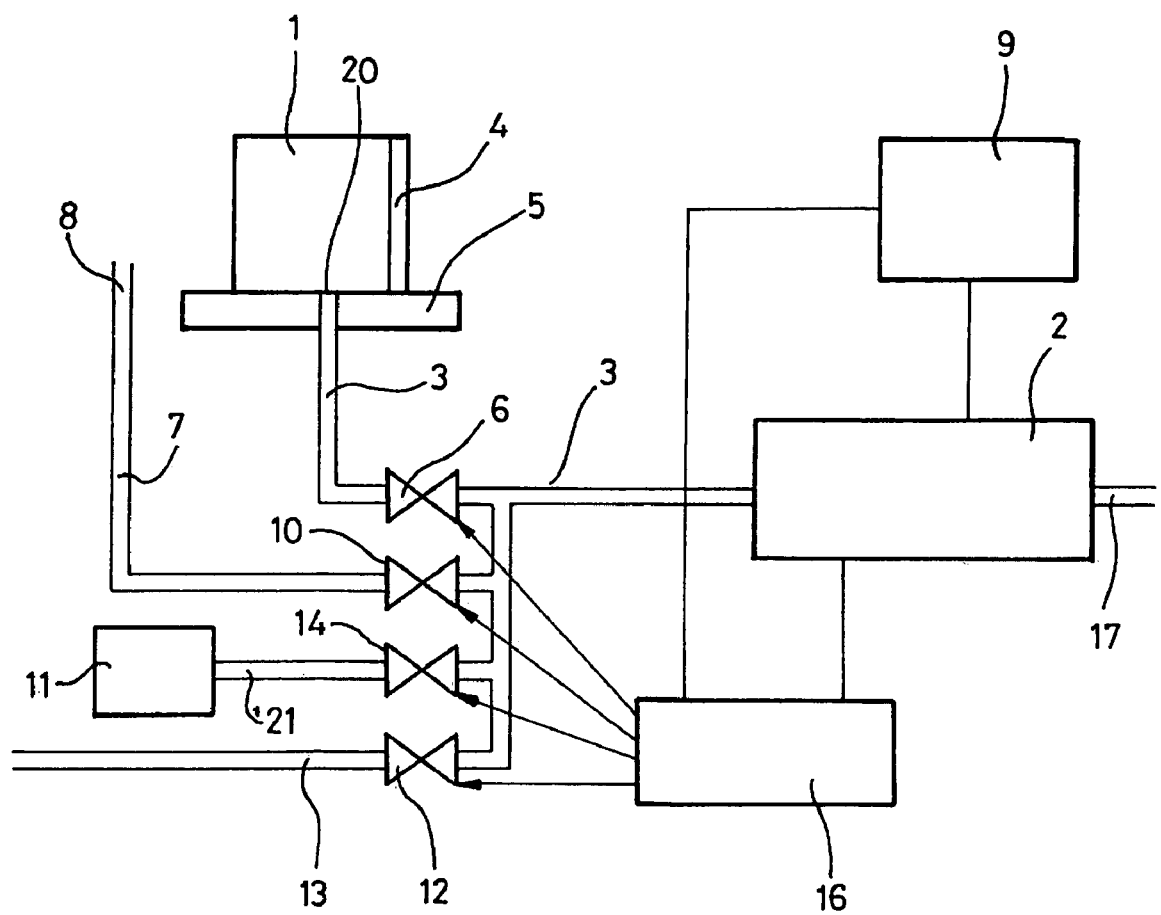

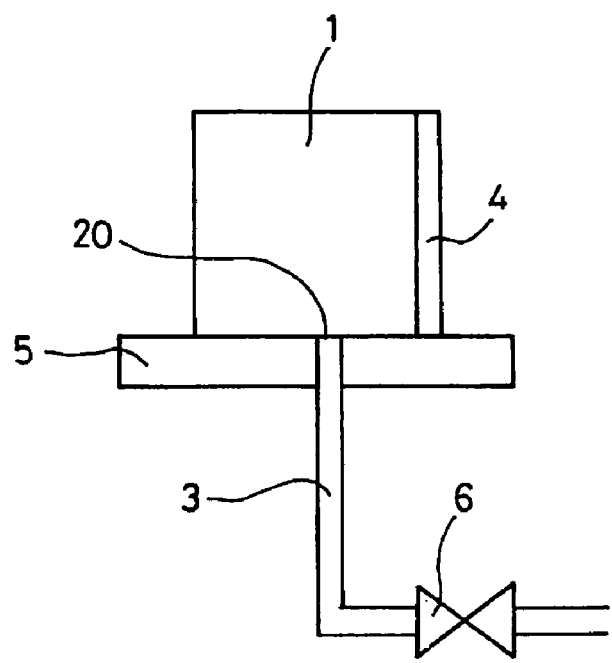
FIG_2
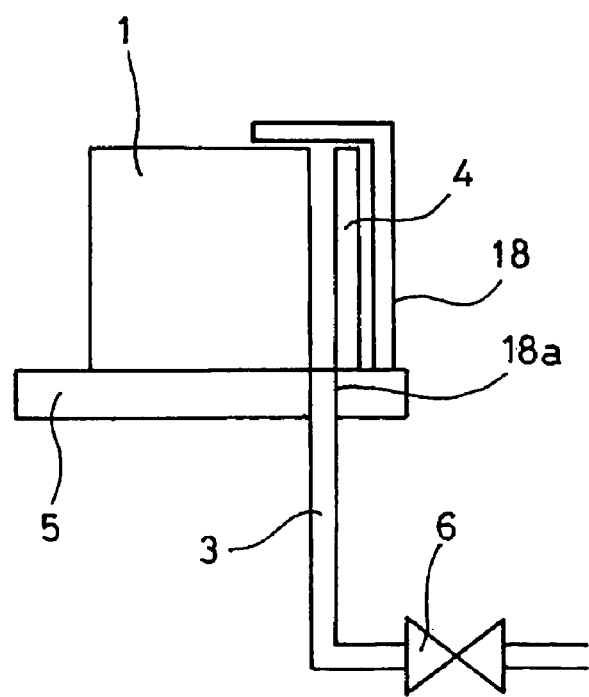
FIG_3

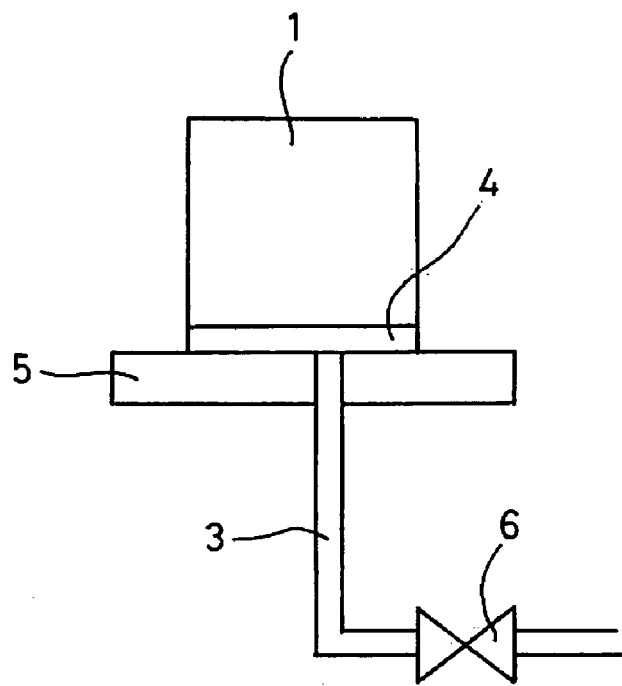
FIG_4
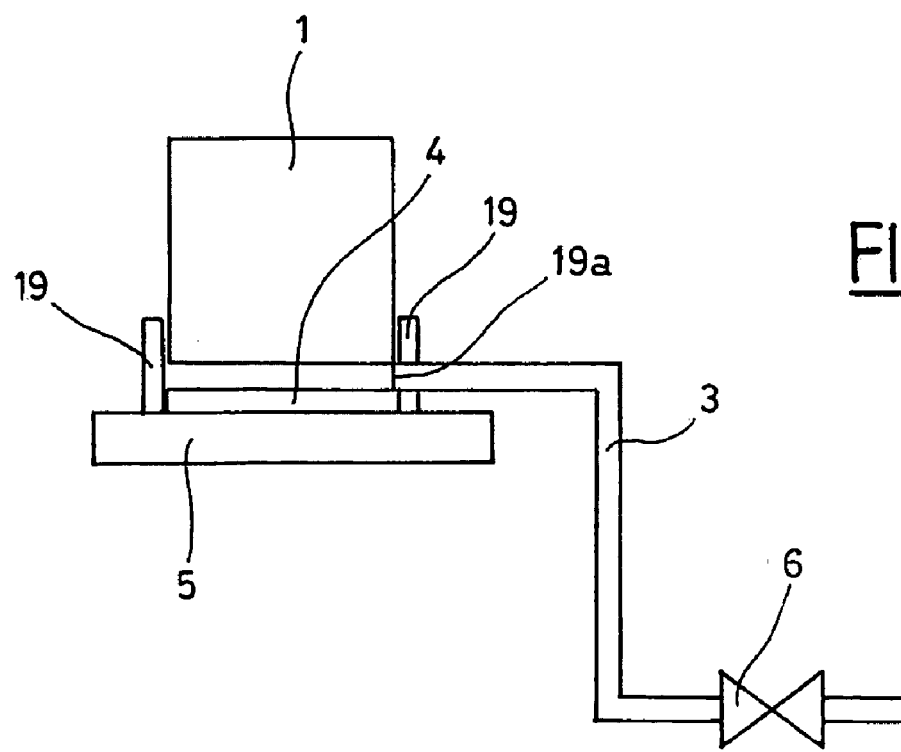
FIG_5

METHOD AND DEVICE FOR MONITORING THE CONTAMINATION OF SUBSTRATE WAFERS

CROSS-REFERENCE TO RELATED APPLICATIONS

This application is based on French Patent Application No. 0550703 filed 18 Mar. 2005, the disclosure of which is hereby incorporated by reference thereto in its entirety, and the priority of which is hereby claimed under 35 U.S.C. §119.

BACKGROUND OF THE INVENTION

1. Field of the Invention

The present invention relates to monitoring the contamination of parts such as substrate wafers in semiconductor and microelectromechanical system (MEMS) fabrication processes.

2. Description of the Prior Art

The ever decreasing size of the active components of semiconductors and microelectromechanical systems make them increasingly sensitive to the presence on their surface or within their mass of foreign bodies that are generally conveyed by the atmosphere that surrounds the substrate wafers during processing. Consequently, the presence of foreign bodies, usually referred to as contamination, must be reduced as much as possible during semiconductor and microelectromechanical system fabrication processes.

For this reason, the fabrication processes are carried out in white rooms where the atmosphere is maintained at a very low level of contamination. The level of contamination of the atmosphere in the white room is monitored continuously.

For example, the document US-2004/0023419 describes a method of measuring the contamination adsorbed on optical surfaces intended for photolithographic processes. The method utilizes a polymer that has a high capacity for adsorbing the compounds liable to constitute gaseous contamination. The polymer is then analyzed using thermal desorption, gas-phase chromatography and mass spectrometry. The polymer should preferably remain in the atmosphere to be monitored for a sufficient time, of the order of a few hours to a few days or a few weeks, to enable the collection of a sufficient mass of contaminants present in the atmosphere at a relatively low concentration. The drawback of this is that the measurement is not effected in "real time" and there is no provision for a tailored and rapid reaction in the event of gaseous contamination at a low concentration.

The document DE-101 33 520 describes another system that determines the properties of the atmosphere in a white room used for the fabrication of semiconductors. The system is incorporated into a standard front-opening transport enclosure (FOUP) so as to have the usual overall dimensions of the transport enclosures that contain the substrate wafers during fabrication. The transport enclosure containing the monitoring system aspirates air from the white room, analyzes it, and returns it to the white room, thereby monitoring the atmosphere in the white room along the route taken by the standard transport enclosures (FOUP) containing the substrate wafers. The parameters measured may be the air temperature in the white room, the relative humidity, the level of particulate pollution and the level of pollution by certain unwanted gases. The measuring system must be adapted to have an overall size less than the interior space available in a standard front-opening transport enclosure (FOUP).

Because of this small size, the measuring devices are unable to measure very low levels of gaseous contamination present in trace amounts of the order of 1 ppb (part per billion).

What is more, the devices cited above do not diagnose the atmosphere contained in the substrate wafer transport enclosures themselves, the measurements being effected globally on the atmosphere of the white room containing the substrate wafer transport enclosures.

Now, these substrate transport enclosures are porous environments that concentrate contaminants and in particular organic, amine and acid contaminants. The substrate wafers are continually exposed to these atmospheres while awaiting processing. After these semiconductor fabrication processes, the substrate wafers are charged with process gases which escape from the substrate wafers and contaminate the walls of the transport enclosures. Such contamination is very harmful to semiconductor substrates such as wafers or masks.

If is found that the contamination monitoring methods known in the art are inadequate, in particular in the case of low level gaseous contamination of substrate wafers or other parts. Such low level molecular gaseous contamination by substitution, addition or doping of the surface of the substrate wafers can create defects that may not be visible using current post-production measurement techniques but will reduce the service life of semiconductors and electromechanical microsystems fabricated in this way.

Low level molecular contamination by substitution, addition or doping of the substrates is a real problem. Semiconductors produced in this way may be declared satisfactory on leaving the plant but it is found that their service life may be shortened. There is therefore a great benefit to be obtained by reducing this low level molecular contamination.

The problem addressed by the present invention is that of reducing further the risks of defects appearing in semiconductors and electromechanical microsystems fabricated by fabrication processes including steps of transporting and/or storing substrate wafers in transport enclosures.

At the same time, the invention aims to avoid all risk of additional contamination of the substrates by adding materials such as gaseous adsorption polymers.

The invention further aims to reduce the risk of transmission of contamination by the substrate wafers or other parts contained in the transport enclosures.

The basic idea of the invention is to monitor the atmosphere in the transport enclosures themselves using powerful external analysis means communicating with the internal atmosphere of the transport enclosures.

As a result, the analysis means can be of a size that is independent of, and in particular greater than, the interior volume of the standard transport enclosures and the isolation of substrate wafers contained in the standard transport enclosure is maintained during analysis.

It is therefore possible to use analysis means capable of providing an analysis in real time, i.e. in a very short time, and of detecting and measuring gaseous contamination at very low concentrations, of the order of 1 ppb.

SUMMARY OF THE INVENTION

To achieve the above and other objects, the invention proposes a device for monitoring the contamination of substrate wafers or other parts in semiconductor or electromechanical microsystem fabrication processes including steps of transporting and/or storing the substrate wafers or other parts in transport enclosures, the device including a gas analyzer including means for ionizing gases and means for identifying the ionized gases by measuring a parameter of the ions.

According to the invention the means for ionizing gases are adapted to ionize gases at atmospheric pressure and the device further includes interface means for establishing direct communication between the gas analyzer and the internal atmosphere of a transport enclosure to perform an analysis in real time of the gases contained in the internal atmosphere of the transport enclosure.

The interface means are preferably adapted to convey a flow of gas to be analyzed from the internal atmosphere of a transport enclosure to the gas analyzer directly and without significant external input. The expression "external input" refers equally to a gas coming from the outside and to a purge gas.

The device therefore captures gases coming from the pod, and only those gases coming from the pod, thanks to the just sufficient volume of the interface means and to the materials used in the means for sampling and conveying the gases to the gas analyzer (pipes, solenoid valve bodies, pump bodies, etc.). The interface means advantageously consist of perfluoroalkoxy (PFA), selected for its high chemical and mechanical stability and its impermeability to gases. Its use therefore minimizes adsorption and release of gases by the material, which is indispensable for measurements at the level of 1 ppb.

Thanks to this feature, it is possible to analyze traces of contaminating gases contained in the transport enclosures in real time. The analysis is also carried out in the atmosphere closest to the substrate wafers or other parts, and is not disturbed by the environment, i.e. by the atmosphere around the transport enclosures.

The device may be used to monitor the contamination of substrate wafers, masks, component parts of process chambers, such as parts that have to be cleaned periodically, or even transport enclosures.

The interface means preferably include isolating means to guarantee that the flow of gas to be analyzed reaching the gas analyzer comes for the most part from the transport enclosure, the flow resulting from leaks from the atmosphere external to the transport enclosure being in the minority. This increases the sensitivity of the analysis.

The device of the invention further includes a transport enclosure.

To perform an analysis that is sufficiently sensitive to detect trace levels of gaseous contamination, one option is to use a gas analyzer of a type adapted to measure the mobility of the ions.

The ion mobility parameter referred to in the description and the claims is defined as the ratio between the terminal velocity reached by an ion placed in an electric field because of the braking forces caused by the viscosity of the medium and the electric field to which the ion is subjected.

Alternatively, the gas analyzer may be of a type adapted to measure the flight time of the ions. The flight time parameter is defined as the time that is necessary for an ion subjected to an electric field to travel a given distance.

One option for ionizing the gases to be analyzed is to employ the conventional method of cracking the gaseous molecules by electron bombardment using IMS instrumentation.

Another option is to perform the ionization using the ion attachment mass spectrometer (IAMS) technology, which bombards the gases to be analyzed with alkaline ions, for example $Li^+$ or $Na^+$ ions, which become attached to the gas molecules and thereby produce a cation. The mass of the ion obtained is then measured using a mass spectrometer and the parameter consisting of the mass of the gas molecule is determined by subtracting the known mass of the alkaline ion.

In practice the interface means may advantageously include:

a passage through the wall of the transport enclosure, and an adapter conformed so that the transport enclosure can be coupled to the adapter with the passage selectively placed in communication with a pipe leading to the gas analyzer.

A first option is for the adapter to include locating means for positioning the transport enclosure so that the passage faces the orifice of the pipe leading to the gas analyzer.

In this case, the locating means may include a lug adapted to engage in a corresponding hole.

Another option is for the transport enclosure to have a door and the device to include an adapter including means for selectively opening said door and collector means for sampling gases from the transport enclosure and transferring them to the gas analyzer, limiting the sampling of gases leaking in from the surrounding atmosphere.

In one embodiment of the invention, the adapter is integrated directly into loading means for transport pods of the front-opening type, in particular front opening universal pods (FOUP), side-opening pods or SMIF type bottom-opening pods. The loading means are situated at the entry to the installation comprising a semiconductor substrate treatment chamber. They enable the pods to be opened and closed before the substrate wafers enter the treatment chamber.

Thus, in order to limit the pollution of the chambers, the device of the invention enables monitoring of contamination of the substrates and/or the transport pods before they are opened and put into communication with the treatment chambers of the equipment. Similarly, before the substrate wafers are stored in the transport pods after treatment, the atmosphere inside the pods is tested for contamination in order for the wafers not to pass any time in a contaminated atmosphere.

Alternatively, the interface means may include a needle connected to the gas analyzer and adapted to pierce the wall of a transport enclosure. By providing a wall portion adapted to be pierced, this solution may be suitable for use with rigid wall transport enclosures such as FOUP or SMIF type transport enclosures. It may also be suitable for use with transport enclosures of the flexible wall envelope type.

The monitoring device of the invention may advantageously comprise means for selectively injecting a purging neutral gas into the gas analyzer. The neutral gas may be nitrogen, for example, supplied by a source of nitrogen.

Means may also be provided for selectively setting up direct communication between the inlet of the gas analyzer and the atmosphere surrounding the transport enclosure, as a result of which the device is also able to analyze the atmosphere of the white room around the transport enclosures.

The interface means then consist of the pipes for conveying the sampled gases and the valves inserted into those pipes to control the flow of the sampled gases.

The reliability of the analysis is further improved by providing means for automating the operation of the various components. Thus there may be provided electronic control means for controlling the operation of the adapter, the gas analyzer and the interface means.

In practice, the electronic control means may comprise a processor and an associated program, the associated program including a measurement sequence in which the processor commands communication between the transport enclosure and the gas analyzer and at least one of the following sequences: a purge sequence in which the processor commands the injection of a neutral gas into the gas analyzer; a calibration sequence in which the processor commands the injection of a reference gas into the gas analyzer; and an external monitoring sequence in which the processor commands the setting up of communication between the gas analyzer and the surrounding atmosphere.

The device of the invention may be installed on a dedicated monitoring station on which fabrication line operatives can check at any time the level of contamination of the internal atmosphere of a transport pod.

Another aspect of the invention proposes a method of monitoring the contamination of wafer substrates or other parts in semiconductor or electromechanical microsystem fabrication processes including transport and/or storage steps in transport enclosures. The method includes a measurement step in which gases are sampled from the interior atmosphere of a transport enclosure and isolated, the sampled gases are ionized and the sampled gases are analyzed by measuring a parameter of the ions obtained by ionization.

The method may include a step of external analysis during which gases are sampled in the atmosphere surrounding the transport enclosure, the sampled gases are ionized and the sampled gases are analyzed by measuring a parameter of the ions obtained by ionization.

Other objects, features and advantages of the present invention will emerge from the following description of particular embodiments of the invention, which description is given with reference to the appended drawings.

BRIEF DESCRIPTION OF THE DRAWINGS

FIG. 1 is a block diagram of one embodiment of a contamination monitoring device of the present invention.

FIG. 2 is a partial view showing a first embodiment of the means for establishing communication between the gas analyzer and the interior atmosphere of a front-opening transport enclosure.

FIG. 3 is a partial view showing a second embodiment of the means for establishing communication between the gas analyzer and the interior atmosphere of a front-opening transport enclosure.

FIG. 4 shows one embodiment of the means for establishing communication between the gas analyzer and the interior atmosphere of a bottom-opening transport enclosure.

FIG. 5 shows another embodiment of the means for establishing communication between the gas analyzer and the interior atmosphere of a bottom-opening transport enclosure.

DETAILED DESCRIPTION OF THE PREFERRED EMBODIMENTS

In the embodiment shown in FIG. 1, the device is adapted to monitor the contamination of substrate wafers or other parts transported in transport enclosures 1 when transferring them from one station to another in a white room.

Standard front-opening transport enclosures of the FOUP type shown in FIG. 1 are used for this, for example.

These FOUP type transport enclosures 1 have a front door 4 with dimensions allowing the insertion and extraction of substrate wafers or other parts and generally have one or more bottom openings 20 fitted with a filter opposing penetration of contaminating particles into the interior of the transport enclosure 1.

The transport enclosure 1 is sealed, but at a relatively low level, allowing air from the atmosphere to pass through the orifices 20 and through leaks in the seal of the door 4, although the leaks are for the most part those via the filters at the orifices 20. The orifices 20 incorporating filters allow air from the atmosphere to enter and leave to equalize the pressure, in particular when closing and opening the door 4.

In FIG. 1, the transport enclosure 1 is coupled to an adapter 5 in the white room constituting a monitoring station.

The adapter 5 connects the filter orifice 20 of the transport enclosure 1 to a pipe 3 that conveys the gases to the input of a gas analyzer 2. A valve 6 in the pipe 3 opens or closes the pipe 3 to selectively enable or interrupt the flow of gases coming from the transport enclosure 1. The valve 6 is controlled by a microcontroller or PLC type processor 16.

The gas analyzer 2 uses the ion mobility spectrometer (IMS) instrumentation principle to measure the mobility of ions, to detect trace amounts of gases and to measure the concentration thereof.

In this kind of gas analyzer, a gas sample is introduced into the reactive portion of a tube in which the molecules are ionized, for example by electron bombardment. The ions resulting from cracking the molecules are injected into a region in which movement of the ions is induced in order to analyze their mobility, which is determined by the velocity reached by positive ions and then negative ions in an electric field. The ions produced are attracted toward an electrode that generates an electric current. That electric current is then processed to obtain the gas concentration (in ppbv).

Alternatively, the sampled gas may be ionized and analyzed using the ion attachment mass spectrometer (IAMS) technology.

A computer 9 is connected to the gas analyzer 2. The computer 9 includes a memory for storing measurements produced by the gas analyzer 2. Software stored in the computer 9 displays data produced by the gas analyzer 2 directly on a screen and stores it in memory. Comments may be added to the measurements via an input screen. Thus the computer 9 constitutes electronic processing means for processing and storing measurement results supplied by the gas analyzer.

The software of the computer 9 also manages triggering thresholds in order to alert the user if the thresholds are exceeded.

The software of the computer 9 is also used to set the parameters of the processor 16, to which the computer 9 is also connected.

When measuring internal contamination, the gases contained in the transport enclosure 1 are aspirated via the pipe 3 to the gas analyzer 2, which thereafter returns them to the white room through the discharge 17. The gases are analyzed as they pass through the gas analyzer 2 and the resulting information is sent to the computer 9.

The pipe 3 and the adapter 5 are sealed to a level sufficient to prevent penetration of unwanted gases from the white room into the interior of the pipe 3 and the gas analyzer 2. This ensures that the gas analyzer 2 essentially analyzes gases coming from the interior atmosphere of the transport enclosure 1. Accordingly, the flow of gas to be analyzed by the gas analyzer 2 comes for the most part from the transport enclosure 1, the flow resulting from leaks from the atmosphere outside the transport enclosure 1 being lower.

In a preferred embodiment of the invention, the transport enclosure 1 is positioned on the adapter 5 by standard locating lugs.

Given that the positions of the filter orifices 20 on the transport enclosures 1 are not standardized, even if the enclosures are of the standard FOUP type, the position of the adapter 5 is adjustable in order to connect to the filter of the transport enclosure 1.

As the transport enclosure 1 may have no inlet orifice 20 in its bottom wall, the adapter 5 includes means for opening the door of the transport enclosure 1 and collector means providing sufficient isolation from the atmosphere of the white room. The measurements are then carried out with the door 4 of the transport enclosure 1 partly open (see below).

In the embodiment shown in FIG. 1, the pipe 3 includes, downstream of the valve 6, three branch connections 7, 13 and 21 provided with respective valves 10, 12 and 14. The branch connection 7 discharges into the internal atmosphere of the white room via an orifice 8 in the vicinity of the adapter 5. The branch connection 13 leads to a reference gas supply. The branch connection 21 leads to a neutral gas supply 11.

The valves 10, 12 and 14 are also controlled by the processor 16.

An arrangement of the above kind is used:
  to measure the external atmosphere in the vicinity of the transport enclosure 1 coupled to the adapter 5 via the orifice 8, the branch connection 7 and the valve 10, in order to quantify the background noise corresponding to the level of pollution of the white room;
  to supply a neutral gas such as nitrogen from the neutral gas supply 11 to purge the measuring cell of the gas analyzer 2;
  to measure a reference gas to verify the calibration of the measuring cell of the gas analyzer 2.

The processor 16 sequences the operation of the valves to carry out the various measurements.

To this end, the processor 16 contains an associated program including a measurement sequence in which the processor commands the setting up of communication between the transport enclosure 1 and the gas analyzer 2 and at least one of the following sequences: a purging sequence in which the processor commands the injection of a neutral gas into the gas analyzer 2 from the neutral gas supply 11; a calibration sequence in which the processor commands the injection of a reference gas via the branch connection 13; and an external monitoring sequence in which the processor commands the setting up of communication between the surrounding atmosphere and the gas analyzer 2 via the branch connection 7 and the orifice 8.

In the embodiment shown in the figures, the pipe 3 and each branch connection 7, 13 and 21 has a respective separate valve 6, 10, 12 and 14.

Alternatively, three-way valves could be used to provide the same function.

Consider now FIGS. 2 to 5, which show four embodiments of the adapter 5 to suit different types of transport enclosure.

FIG. 2 repeats the structure shown in FIG. 1, with an adapter 5 conformed to constitute a support plane on which rests a standard front-opening transport enclosure 1 of the FOUP type. The front door 4 and the bottom orifice 20 provided with a filter that connects to the pipe 3 fitted with a valve 6 can also be seen.

In FIG. 3, the adapter 5 is designed to cooperate with a front-opening transport enclosure 1 that has no bottom orifice 20 that can be connected to the pipe 3. In this case, the adapter 5 comprises a collector 18 providing a sampling enclosure surrounding the front door 4 and authorizing at least partial opening of the front door 4. The sampling enclosure defined by the collector 18 is connected to the pipe 3 via a bottom orifice 18a.

In FIG. 4, the adapter 5 is conformed to cooperate with a bottom-opening transport enclosure 1, for example a standard SMIF type enclosure. In this case, the door of the transport enclosure 1 is a bottom door 4 which is provided with an orifice to which the pipe 3 may be connected via the adapter 5.

FIG. 5 shows an adapter structure 5 conformed to cooperate with a transport enclosure 1 of the SMIF type, i.e. of the bottom opening type, but in which the bottom door 4 has no orifice that may be connected to the pipe 3. In this case, the adapter 5 comprises a collector 19 defining a sampling enclosure around the opening of the transport enclosure 1 and authorizing at least partial opening of the bottom door 4. A lateral orifice 19a enables the pipe 3 to be connected to the interior of the sampling enclosure in the collector 19.

In use, the device measures the contamination present in a transport enclosure 1; during this measurement, gases are sampled in the transport enclosure 1, the sampled gases are ionized and the ionized gases are analyzed by measuring a parameter of the ions obtained by this ionization.

The measurement method may advantageously comprise an external analysis step during which gases in the atmosphere surrounding the transport enclosure 1 are sampled via the branch connection 7 and the orifice 8, the sampled gases are ionized and the ionized gases are analyzed by measuring a parameter of the ions obtained by this ionization.

The method may comprise a purge step during which a neutral gas such as nitrogen is injected into the gas analyzer 2.

The method may comprise a calibration step during which a reference gas is injected into the gas analyzer 2 via the branch connection 13.

The method defined above is a first application of the invention, for measuring the contamination present in the interior atmosphere of the transport enclosure 1, which is an approximation of the contamination present on the substrate wafers or other parts that the transport enclosure 1 may contain.

In a second application, the method may comprise a differential measurement sequence including measurement of the contamination in the transport enclosure 1 before a treatment process is applied to substrate wafers contained in the transport enclosure 1 and measurement of the contamination in the transport enclosure 1 after said treatment process and reintroduction of the treated substrate wafers into the transport enclosure 1.

In another application, the method may comprise a preliminary monitoring step during which the contamination in the open or closed transport enclosure 1 is measured before inserting substrate wafers or other parts into it.

In another application, the contamination may be measured in a transport enclosure 1 after removing the substrate wafers or other parts. The enclosure having a low conductance, the contaminating gases may remain present inside the enclosure for several hours. This provides a trace of events on the substrates or other parts over a period of several hours, by virtue of a memory effect.

In another application, an open or pierced transport enclosure may be placed in various areas of the white room. After placing it in a given area of the white room, the enclosure may be closed again and then taken to the monitoring system to measure the contamination. In this way the invention enables contaminants in all areas of the white room to be determined.

The benefit of the invention is that it enables a single device to measure in real time low levels of contamination induced by gases in a plurality of areas.

The contamination measurements are effected with no risk of additional contamination of the substrates or other parts contained in the transport enclosures, such as might be induced by adding test materials such as adsorbent polymers.

Contamination can even be measured inside the transport enclosure 1 without having to remove the substrate wafers or other parts.

There is claimed:

1. A device operable to monitor contamination of substrate wafers or other parts in semiconductor or electromechanical microsystem fabrication processes comprising:
   a gas analyzer comprising means for ionizing gases and means for identifying the ionized gases by measuring a parameter of the ions, wherein the means for ionizing gases ionize gases at atmospheric pressure;
   a transport enclosure for said substrate wafers and said other parts;
   an interface means for establishing direct communication between said gas analyzer and an internal atmosphere of said transport enclosure; and
   means for selectively injecting a purging neutral gas into said gas analyzer.

2. A device according to claim 1, wherein said interface means are configured to convey a flow of gas to be analyzed from said internal atmosphere of said transport enclosure to said gas analyzer directly and without significant external input.

3. A device according to claim 1, wherein said interface means comprises a material which is perfluoroalkoxy (PFA).

4. A device according to claim 1, wherein said gas analyzer is operable to measure the mobility of said ions.

5. A device according to claim 1, wherein said gas analyzer is operable to measure the flight time of said ions.

6. device according to claim 1, wherein said gas analyzer is operable to measure the mass of said ions.

7. A device according to claim 4, wherein said gases are ionized by electron bombardment.

8. A device according to claim 4, wherein said gases are ionized by bombardment with alkaline ions that become attached to the molecules of said gases.

9. A device according to claim 1, wherein said interface means comprises: a passage through the wall of said transport enclosure; and an adapter conformed so that said transport enclosure can be coupled to said adapter with said passage selectively placed in communication with a pipe leading to said gas analyzer.

10. A device according to claim 1, wherein said means for selectively injecting a purging neutral gas into said gas analyzer comprises a source of nitrogen.

11. A device according to claim 1, further comprising means for selectively setting up direct communication between an Inlet of said gas analyzer and an atmosphere surrounding said transport enclosure.

12. A device according to claim 1, further comprising electronic control means for controlling the operation of said gas analyzer and said interface means.

13. A device according to claim 1, further comprising electronic processing means for processing and storing measurement results supplied by said gas analyzer.

14. A device according to claim 12, wherein said electronic control means comprises a processor and an associated program, said associated program comprising a measurement sequence in which said processor commands communication between said transport enclosure and said gas analyzer and at least one of the following sequences: a purge sequence in which said processor commands the injection of a neutral gas into said gas analyzer; a calibration sequence in which a processor commands the injection of a reference gas into said gas analyzer; and an external monitoring sequence in which said processor commands the setting up of communication between said gas analyzer and the surrounding atmosphere.

15. A device operable to monitor contamination of substrate wafers or other parts in semiconductor or electromechanical microsystem fabrication processes comprising:
   a gas analyzer comprising means for ionizing gases and means for identifying the ionized gases by measuring a parameter of the ions, wherein the means for ionizing gases ionize gases at atmospheric pressure;
   a transport enclosure for said substrate wafers and said other parts; and
   an interface means that establishes direct communication between said gas analyzer and an internal atmosphere of said transport enclosure, and is configured to convey a flow of gas to be analyzed from said internal atmosphere of said transport enclosure to said gas analyzer; wherein the interface means comprises: (a) a passage through the wall of said transport enclosure; (b) an adapter connected to said passage which is conformed such that said wall of said transport enclosure couples to said adapter; and (c) a pipe connected to said adapter leading to said gas analyzer, wherein said adapter further comprises locating means for positioning said transport enclosure onto said adapter so that said passage faces the orifice of said pipe leading to said gas analyzer.

16. A device according to claim 15, wherein said locating means comprises a lug adapted to engage in a corresponding hole.

17. A device according to claim 15, wherein said adapter is integrated directly into a transport pod loading means.

18. A device operable to monitor contamination of substrate wafers or other parts in semiconductor or electromechanical microsystem fabrication processes comprising:
   a gas analyzer comprising means for ionizing gases and means for identifying the ionized gases by measuring a parameter of the ions, wherein the means for ionizing gases ionize gases at atmospheric pressure;
   a transport enclosure for said substrate wafers and said other parts comprising a pierceable wall; and
   an interface means that establishes direct communication between said gas analyzer and an internal atmosphere of said transport enclosure, and is configured to convey a flow of gas to be analyzed from said internal atmosphere of said transport enclosure to said gas analyzer, wherein the interface means comprises a needle connected to said gas analyzer, said needle being configured to pierce said pierceable wall of said transport enclosure.

19. A method of monitoring contamination of substrate wafers or other parts in semiconductor or electromechanical microsystem fabrication processes performed in a transport enclosure, said method comprising:
   a measurement step in which gases are sampled from an interior atmosphere of said transport enclosure and isolated, the sampled gases are ionized and said ionized sampled gases are analyzed by measuring a parameter of the ions obtained by the ionization by a gas analyzer; and
   an external analysis step during which gases are sampled in the atmosphere surrounding said transport enclosure, the sampled gases are ionized and said sampled gases are analyzed by measuring a parameter of the ions obtained by the ionization by said gas analyzer.

20. A method according to claim 19, further comprising a purge step during which a neutral gas is injected into said gas analyzer.

21. A method according to claim 19, further comprising a calibration step during which a reference gas is injected into said gas analyzer.

22. A method according to claim 19, further comprising a differential measurement sequence including measurement of the contamination in said transport enclosure before a treatment process is applied to said substrate wafers contained in said transport enclosure and measurement of the contamination in said transport enclosure after said transport process and reintroduction of the treated substrate wafers into said transport enclosure.

23. A method according to claim 19, further comprising a preliminary monitoring step during which the contamination in the open or closed transport enclosure is measured before introducing said substrate wafers or said other parts into it.

* * * * *